DIGITAL TURRET TUNING DEVICE

Filed March 9, 1961 3 Sheets-Sheet 1

INVENTORS.
ROBERT C. DIDIER
MELVIN W. REDMOND, JR.
BY EDWARD R. SCHICKLER
Daniel D. Sharp
ATTORNEY

DIGITAL TURRET TUNING DEVICE

Filed March 9, 1961

3 Sheets-Sheet 2

Sept. 14, 1965 R. C. DIDIER ETAL 3,206,699

DIGITAL TURRET TUNING DEVICE

Filed March 9, 1961 3 Sheets-Sheet 3

United States Patent Office 3,206,699

Patented Sept. 14, 1965

3,206,699

DIGITAL TURRET TUNING DEVICE

Robert Charles Didier, Rochester, and Edward Raymond Schickler, Webster, N.Y., and Melvin W. Redmond, Jr., Hamden, Conn., assignors to General Dynamics Corporation, Rochester, N.Y., a corporation of Delaware Filed Mar. 9, 1961, Ser. No. 94,516

14 Claims. (Cl. 334—2)

This invention relates to a tuning device and, more particularly, to a turret tuner having independent mechanically controllable selector means.

Tunable broadband communication equipment often must be characterized by a short time for changing frequency in order to reduce to a minimum the non-available period of the equipment. Continuous tuning is unsatisfactory in such cases because of the considerable time consumed in mechanical adjustment. In addition, the usual analog techniques of mechanical tuning, such as rotation of a tuning condenser shaft or motion of tuning slugs in coils, may not provide the accuracy of tuning necessary in such communication systems as carrier suppressed single sideband systems. Although the use of electric tuning by saturable reactors or variable dielectric capacitors has resulted in some improvement in tuning speed, accuracy of such electrical tuning may be difficult to obtain. For example, hysteresis effects in saturable reactor materials and the effect of temperature upon permeability and Q of saturable reactor materials presents a severe problem. Considerable distortion may be generated in variable dielectric tuning because of unbalance between the variable dielectric elements, particularly at high signal levels; moreover, tracking difficulties often arise when variable capacitance diodes are used in tuned circuits.

Some of the problems inherent in analog tuning have been overcome by the technique of digital selective tuning which involves selective synthesis of one or more tuned circuits by step-wise switching into circuit pretuned or fixed components constituting different portions of each tuned circuit by independently controllable selectors. No variable or continuously tuned elements are used, except for trimming. This technique has been set forth in an application of Roger R. Bettin, Alwin Hahnel, John E. R. Harrison and Elmer W. Schwittek, for U.S. Letters Patent, Serial No. 42,698, filed July 13, 1960, entitled, "Digitally Tuned Transmitter-Receiver," now Patent No. 3,054,057. With such a technique, no precise mechanical positioning adjustable tuning elements are required. Furthermore, the value of components selected by one selector need not change regardless of the position of the other selectors; thus the need for complex electrical or mechanical conversion devices, such as differential gears, closed loop servos, and the like, is eliminated. Moreover, the time required to select a frequency may be of the order of milliseconds and each of the several tuning functions can be accomplished with no sequential interdependence.

An object of this invention is to provide a tuner for use in a system such as described in the aforesaid application wherein the independently controllable selectors, the selected components, and the fixed components may be mounted conveniently in a compact package.

In many instances, more than one tuned circuit must be tuned simultaneously. By way of example, the turret tuner according to the invention was used in a two-stage amplifier with a double tuned input circuit; this amplifier requires two amplifying electron devices and four separate tuned circuits. Each of the tuned circuits includes separate tuned circuit portions which, when combined, provides step-wise tuning over a considerable frequency range. Another object of the invention, then is to provide a tuner which permits rapid and accurate step-wise tuning of a plurality of tuned circuits simultaneously by independently controlled selection of said tuned circuit portions.

Another object of the invention is to provide a tuner in which the length of leads between the tuned circuit portions, and the leads between the tuned circuit(s) and the electron device(s) be relatively short in order to minimize the capacitance and inductance presented by the leads. This reduction in lead length is particularly important at the higher frequency end of the operating band. The turret tuner of the invention fulfills this requirment in a manner to be set forth in greater detail subsequently.

The tuner according to the invention is readily adaptable for shielding the individual tuned circuits from one another—and objective which is necessary in accurate tuning of a plurality of tuned circuits with a single device.

The turret tuner according to the invention also is so constructed that the variable components, used principally for fine adjustments and compensation for tolerances in fixed components values, may be tuned readily after assembly of the constituent parts of the tuner.

A typical scheme for tuning equipment by this method is characterized in that the frequency increment achieved in proceeding from a given position of the first selector to the adjacent position is an integral number of times greater than the frequency increment for adjacent positions of a second selector; similarly, the frequency increment achieved for adjacent positions of the second selector is an integral number of times greater than that of adjacent positions of the third selector. In practice, the integral number usually is 10 so that a decimal relationship between the various selectors is provided. In order to explain the invention more simply, it will be assumed that the individual selectors produce changes in frequency between adjacent positions of the selector of a megacycle, 100 kilocycles and 10 kilocycles, respectively. It should be understood, however, that the invention is not limited to incremental variations of these absolute and relative magnitudes. It will be assumed that more than one tuned circuit is involved, for purposes of explanation. In the application of the invention exemplified, it was not necessary to tune the 1 kc. step since the bandwidth of the circuits was of the order of 10 kc. and tuning in 10 kc. steps was entirely adequate. In this application, which involved a band of twenty-eight megacycles, each circuit consisted of twenty-eight different megacycle portions, ten 100 kc. portions and ten 10 kc. portions. The number of megacycle portions will depend, of course, upon the desired bandwidth. Each megacycle portion for a given tuned circuit includes at least a coil which may be tuned after assembly. A fixed capacitor, usually accompanied by a tunable capacitor, is connected in circuit with coil. The fixed capacitor may be used for proper tracking as the various portions of the tuned circuit are varied, while the variable capacitor takes care of small fluctations in value for different fixed capacitors. The various megacycle portions for each tuned circuit are attached to the periphery of a rotatable turret open in the center and driven from its outer edge by a position controlling motor. Each megacycle portion includes appropriate contacts which extend radially into the interior of the turret.

The 100 kc. portions, as well as the 10 kc. portions, include a group of capacitors mounted on respective 100 kc. and 10 kc. discs, with a separate disc for each of the tuned circuits. Terminal blades are attached to the edge of each disc. A 100 kc. disc and a 10 kc. disc may be placed back-to-back for each tuned circuit. A separate ground ring for each tuned circuit may be located adjacent the corresponding 10 kc. and 100 kc. discs. A shaft runs through the center of these discs with the 100 kc. discs being fastened to the shaft and the 10 kc. discs freely rotatable about the shaft. The stack of 100 kc. discs, 10 kc. discs, and the ground ring is located within the turret. The 100 kc. discs are attached to the aforesaid shaft and the desired 100 kc. portion is selected in accordance with the degree of rotation of that shaft. The 10 kc. discs are caused to rotate freely about the aforesaid shaft by means of gears or other couplings which, in turn, are driven by a separate shaft. Selection of a desired 10 kc. portion is determined by the degree of rotation of the last mentioned shaft. The electron devices and miscellaneous components, such as resistors and decoupling capacitors, also are mounted within the turret. As previously stated, the various circuit leads must be maintained as short as possible, particularly at the high frequency end of the operating frequency band. A first stationary contact assembly is mounted within the turret in a position such that the contacts can engage contacts of a selected one of the megacycle portions of each tuned circuit. The annular position of the turret necessary to bring a selected megacycle portion in juxtaposition with a first stationary contact assembly can be selected by appropriate motor control means. A pair of contiguous stationary contact assemblies are mounted within the turret adjacent the stack of 100 kc. and 10 kc. discs and the ground rings associated therewith. The contact of this pair of stationary contact assemblies engage the terminal blades on the 100 kc. and 10 kc. discs and the peripheral portion of the ground rings. Circuit connections are made between the various stationary contact assemblies and between portions of the first contact assemblies and the electron devices mounted within the turret. Owing to the proximity of the rotating portions of the mechanical tuner assembly to the stationary contacts and other electron devices, short lead lengths are readily possible.

When more than one tuned circuit is used, oscillation shielding between these tuned circuits is necessary. This shielding may be achieved readily by electrically conductive means inserted between appropriate tuned circuit discs; the shielding means may include electrically conductive contact strips attached to the tuner chassis and resiliently engaging either the gears which float on the 100 kc. shaft or a disc fixedly secured to the same shaft.

Other objects of the invention may be determined by referring to the specification and the drawings wherein.

Figure 1:
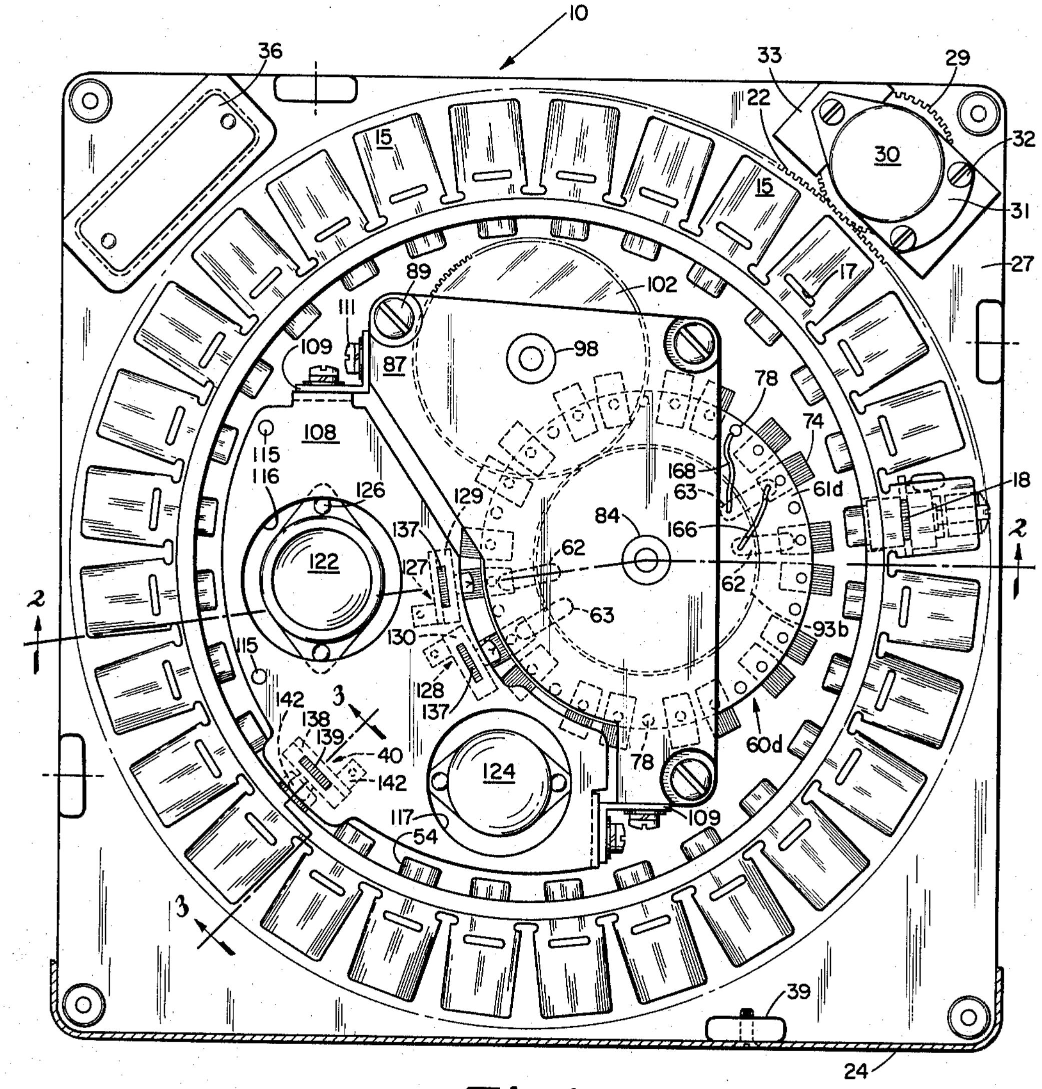
FIG. 1 is a plan view of a mechanical tuning device according to the invention.
Figure 2:
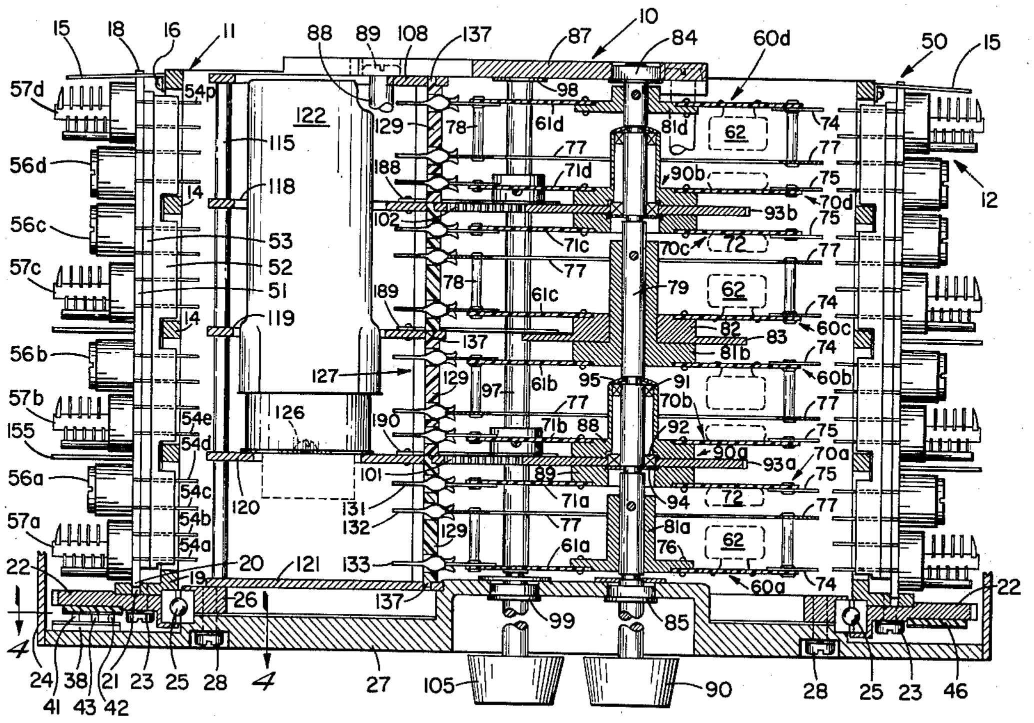
FIG. 2 is a section view of the tuning device of FIG. 1 taken along line 2—2 of FIG. 1.

The tuner assembly 10 includes a generally cylindrical lightweight turret 11 for mounting about the periphery thereof several megacycle component assemblies 12. The turret may be made of a lightweight material, such as aluminum, and preferably is of slotted construction to reduce the mass of the structure and to provide passages for electrical connections between the megacycle component assemblies and the other components located within the turret. The slotted turret is re-enforced by horizontal ribs 14 which may be spaced at intervals along the length of the slot. Several retaining springs 15 equal in number to the number of megacycle component assemblies are attached, as by screws 16 visible in FIG. 2, to the periphery of the turret at one end thereof. Each retaining spring contains a slot 17 for receiving a tongue 18 formed at the upper end of each megacycle component assembly 12. The other end of the turret 11 is provided with a slotted flange 19; each megacycle component assembly 12 includes a tongue 20 which is inserted within a corresponding slot 21 in this flange. Each of the megacycle component assemblies can be inserted or removed readily by a slight upward flexure of the appropriate spring 15. The turret flange 19 is fastened to the upper face of a ring gear 22 by screws 23. The ring gear 22 is mounted, in turn, to rotate on a bearing 25; this bearing is retained by means of a retaining ring 26 which is attached by screws 28 to the base 27 of the tuner assembly 10. A portion of a cover 24 for the tuner assembly is shown in FIG. 2. This cover includes legs, not shown, which may fit in slot 39 in the base 27. The annular gear 22 meshes with a gear 29 keyed to the shaft of a driving motor 30. The motor 30, visible in FIG. 1, includes a mounting bracket 31 attached by screws 32 to a U-shaped protuberance 33 formed in the cast base 27.

A single stationary contact assembly 40 mounted adjacent the interior surface of the turret 11 is adapted to make contact with a selected one of the megacycle component assemblies 12. The assemblies 12 and 40 will be described in greater detail subsequently.

Figures 3, 4, 5:
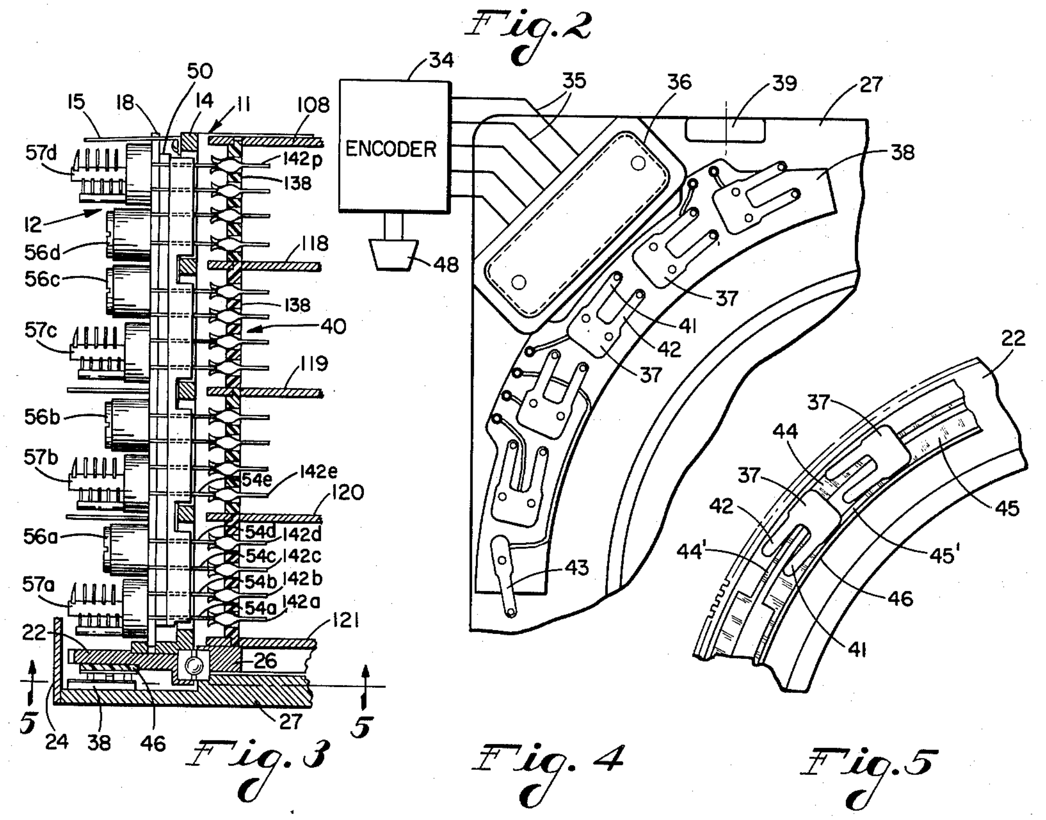
FIG. 3 is a detail view of a portion of the device shown in FIG. 2, illustrating the cooperation between the outer portion of the tuned circuits and one of the stationary contact assemblies.
FIG. 4 is a view illustrating a position control system for the turret tuner.
FIG. 5 is a fragmentary view, taken along line 5—5 of FIG. 3, showing certain details of the turret position control system.

In order to select a particular megacycle portion of the tuned circuit or circuits, a shaft position encoder 34 is suitably mounted adjacent the turret, as shown schematically in FIG. 4. The encoder may include an encoding disc with a common ground ring and five output leads 35 which pass through a connection box 36 on the tuner assembly to corresponding U-shaped fixed resilient contact elements 37. These contact elements are staked to an electrically insulating strip 38 attached to the base 27 of the turret assembly, as shown in FIG. 4. Each resilient contact element 37 has two contacts 41 and 42. In addition, a common contact 43 is connected to the insulating strip 38. The fixed contacts 41 and 42 resiliently and periodically engage electrically conductive concentric encoding rings 44 and 45; these rings are formed on the surface of an electrically insulating annulus 46 which is attached to gear 22; see FIG. 5. Each of the encoding rings 44 and 45 is a mirror image of the other. Ring 44 and ring 45 each has a continuous or common portion 44′ and 45′, respectively. The common portion 44′ of one of the rings 44 is connected to the fixed common contact 43 mounted on base 27. The contact 43, in turn, is connected to one terminal of turret drive motor 30. The other terminal of motor 30 is connected to the positive terminal of a direct current voltage supply whose negative terminal is at ground potential. The encoder 34 has a common ground terminal. By rotating the encoder dial 48 to the position corresponding to the megacycle component desired, the various contacts on the encoder are either connected to or disconnected from the common ground. For a given encoder setting, there will be but one position of the encoding rings 44 and 45, that is, only one position of the turret, in which a break in the ground return path for the motor occurs. In this position the motor will be deenergized and will come to rest. The motor will continue to rotate, however, until the proper turret position is achieved in accordance with the setting of the dial 48 of encoder 34. For each position of the encoder dial, a particular one, and only one, of the megacycle component assemblies 12 will be brought into contact with the stationary contact assembly 40.

Each of the megacycle component assemblies 12 includes an electrically insulating compound mounting member 50 including a component board 51 upon which is mounted appropriate components and printed circuitry, and a laminated terminal strip 52, 53 cemented to the strip 51. The terminal strip 52 is recessed in the regions occupied by the supporting ribs 14 of turret 11. A plurality of contact blades 54 extend through the terminal strip 52 and into slits 55 (see FIG. 7) provided in terminal strip 51. These contact blades will be designated 54*a*, 54*b*, 54*c*, etc., starting from the bottom of the assembly 12 and continuing consecutively to the top of that assembly.

In the example shown in the drawing, a two-stage amplifier is assumed which has a double tuned input circuit in the first stage, a tuned output circuit in the first stage and a tuned output circuit in the second stage. Each megacycle component assembly 12 is separated into four sections in the example illustrated; these four sections correspond to each of the tuned circuits incorporated in the two-stage amplifier. Any number of sections can be used, of course, depending on the particular amplifier and the number of tuned circuits involved therein. Each section of the mounting member 50 of a given megacycle component assembly 12 carries at least one frequency determining capacitive portion and at least one frequency determining inductive portion. The output tuned circuit of the second amplifier includes an inductive portion 56*a* and a capacitive portion 57*a*. Likewise, the output tuned circuit of the first amplifier stage includes an inductive portion 56*b* and a capacitive portion 57*b*. A double tuned input tuned circuit for the first amplifier stage includes the portions 56*c* and 57*c*, together with portions 56*d* and 57*d*. If a single tuned input tuned circuit were used instead of the double tuned circuit for the first amplifier stage, each megacycle component assembly 12 would then include three sections rather than four sections. The number of megacycle component assemblies peripherally mounted about the turret 11 will depend upon the number of megacycle frequency increments desired. For example, in the tuner shown, twenty-eight megacycle component assemblies are used to cover a frequency range of twenty-eight megacycles.

In addition to the megacycle component assemblies 12, the tuner includes a number of one hundred kilocycle component assemblies 60 and a number of ten kilocycle component assemblies 70 equal to the number of tuned circuits in the amplifier. Each of the one hundred kilocycle component assemblies 60 includes a one hundred kilocycle component disc 61, while each of the ten kilocycle component assemblies 70 includes a ten kilocycle component disc 71. In the example illustrated, four similar one hundred kilocycle component assemblies, designated as 60*a*, 60*b*, 60*c* and 60*d*, as well as four separate ten kilocycle component assemblies, designated as 70*a*, 70*b*, 70*c* and 70*d*, are shown, since there are four tuned circuits involved. Each of the one hundred kilocycle component discs 61*a*, 61*b*, 61*c* and 61*d* have ten pairs of interconnected capacitors 62 and 63 mounted thereupon, while the ten kilocycle component discs 71*a*, 71*b*, 71*c* and 71*d* each carry ten capacitors 72; see FIG. 7. The use of ten capacitors or ten sets of capacitors, as the case may be, provides decade tuning between each of the megacycle steps. Terminal blades 74 and 75 are staked along the periphery of the one hundred kilocycle component discs 61 and the ten kilocycle component discs 71, respectively; terminals of the various capacitors are attached to these terminal blades in a manner to be described subsequently in greater detail.

The stack of ten kilocycle discs 71 and one hundred kilocycle component discs 70 are located inside the turret 11 with centers aligned. For each tuned circuit, a one hundred kilocycle component disc 71 and a ten kilocycle component disc 61 is placed back-to-back with a ground ring 77 interposed therebetween. The ground ring 77 in each case is supported from the corresponding one hundred kilocycle component disc 70 by posts 78 staked to the ground ring and to the one hundred kilocycle component disc. A shaft 79 passes through the center of discs 71 and 61 and rings 77, with the one hundred kilocycle component discs 71 fastened to the shaft and the ten kilocycle component discs 70 turning freely on the shaft. By turning a control knob 90 on shaft 79, an operator may select the proper capacitor combination 62, 63 for each of the four tuned circuits simultaneously; in this manner, the frequency of operation of each of the four tuned circuits may be adjusted in hundred-kilocycle steps.

The one hundred kilocycle component discs 61*a*, 61*b* and 61*d* are secured, as by rivets 76, to respective central hubs 81*a*, 81*b* and 81*d*; each of these hubs is pinned to the shaft 79. The one hundred kilocycle component disc 61*c* is riveted to a sleeve 82 secured, as by rivets, to hub 81*b*. Sleeve 82 includes a discoidal portion 83 which, in a manner to be explained more fully later, serves as a shield between two adjacent tuned circuits. The shaft 79 is mounted in bearings 84 and 85 located in the mounting plate 87 and base 27, respectively. The mounting plate 87 is supported in spaced relation with the base 27 by tubular support rods 88 through which pass bolts 89 which can be screwed into thread apertures in base 27.

The ten kilocycle component assembly discs 71*a* and 71*b* are part of a ten kilocycle rotatable unit 90*a* which is free to rotate on bearings 91 and 92 about shaft 79. The ten kilocycle component discs 71*a* and 71*b* are attached to respective hub portions 88 and 89 of the rotatable unit 90*a*. A gear 93*a* is interposed between the hub portions 88 and 89. Appropriate fastening means may be used, not only to attach discs 71*a* and 71*b* to the respective hub portions 88 and 89, but also to maintain gear 93*a* and the corresponding back-to-back ten kilocycle component assembly discs 71*a* and 71*b* in the proper spaced relationship. The hub portions 88 and 89 and the interposed gear 93*a* are riveted together. The entire rotatable unit 90*a* is maintained in the proper axial position along shaft 79 by retaining rings 94 which fit within recesses 95 in shaft 79. A similar rotatable unit 90*b* serves to mount the ten kilocycle component assembly discs 71*c* and 71*d* and its gear 93*b* for free rotation about shaft 79. A shaft 97 extends through bearings 98 and 99 supported by mounting plate 87 and base 27, respectively. Annular gears 101 and 102 are keyed to the shaft 97 and mesh with respective gears 93*a* and 93*b*. Rotation of control knob 105 on shaft 97 imparts rotary motion to the ten kilocycle component assembly discs 71*a*, 71*b*, 71*c* and 71*d* to select the proper capacitor 72 for each of the tuned circuits. In this manner, the frequency of operation of each of the four tuned circuits may be adjusted in ten kilocycle steps.

A supporting plate 108 is supported from mounting plate 87 by one or more brackets 109 secured to the mounting plate 87 by screws 111. A group of posts 115 terminating at opposite ends at the supporting plate 108 and the base 27 provide additional support for plate 108 and also provide means for mounting a series of apertured supporting plates 118, 119, 120 and 121 in spaced relationship.

In order to shield the various tuned circuits from one another, the gears 93a and 93b and the discoidal portion 83 of the rotary sleeve 82 are grounded. Resilient conductive strips 188, 189 and 190 are secured to respective supporting plates 118, 119 and 120, as shown in FIG. 2. The strips 188 and 190 extend over the respective gears 93b and 93a and resiliently contact these gears as they rotate. The contacting strip 188 which contacts gear 93b is shown in detail in FIG. 6. The contacting strip 189 makes a wiping contact with discoidal portion 83 of the electrically conductive sleeve 82. By grounding the gears 93a and 93b and portion 83 of sleeve 82, a separate ground return path for each tuned circuit is provided, thereby minimizing undesirable coupling between stages.

The two apertures 116 and 117 in each of plates 108, 118 and 119 allow for insertion of the two amplifier tubes 122 and 124, respectively. The plate 120 serves as a shelf to which the socket of the tubes 122 and 124 may be attached, as by screws 126. Plate 120 is provided with apertures through which the socket pins for the tube may extend. The plates 108, 118, 119, 120 and 121 provide support for a pair of contiguous stationary terminal assemblies 127 and 128 made up, respectively, of four separate electrically insulating strips 129 and 130. A group of three individual stationary contacts pass through each of the four strips 129 and another group of two contacts pass through each of the four strips 130. The three contacts for each strip 129 of the terminal assembly 127 are designated 131–133, while the two contacts for each of the four strips 130 of terminal assembly 128 are designated 134–135. Each of strips 129 and 130 includes a tongue 137 which may be inserted within appropriate slots in the corresponding supporting plate, as shown in FIG. 2.

Previously, the stationary contact assembly 40 was stated to be arranged to make contact with a selected one of the rotatable megacycle component assemblies 12. This stationary contact assembly 40, like stationary terminal assemblies 127 and 128 just described, is supported from supporting plates 108, 118, 119, 120 and 121, as shown in FIG. 2. The contact assembly 40 includes a group of four separate contact strips 138, each provided with a tongue 139 which may be inserted within a slot in the corresponding supporting plate. The four identical contact strips 138 of stationary contact assembly 40 each contain four contact blades 142 designated as 142a, 142b, 142c, etc., starting from the bottom of the contact assembly 40 and continuing successively to the top of the assembly. These contact blades 142a, 142b, etc., wipe across respective contact blades 54a, 54b, etc., of the particular megacycle component assembly 12 which is selected by encoder 34.

Figures 6, 7, 8:
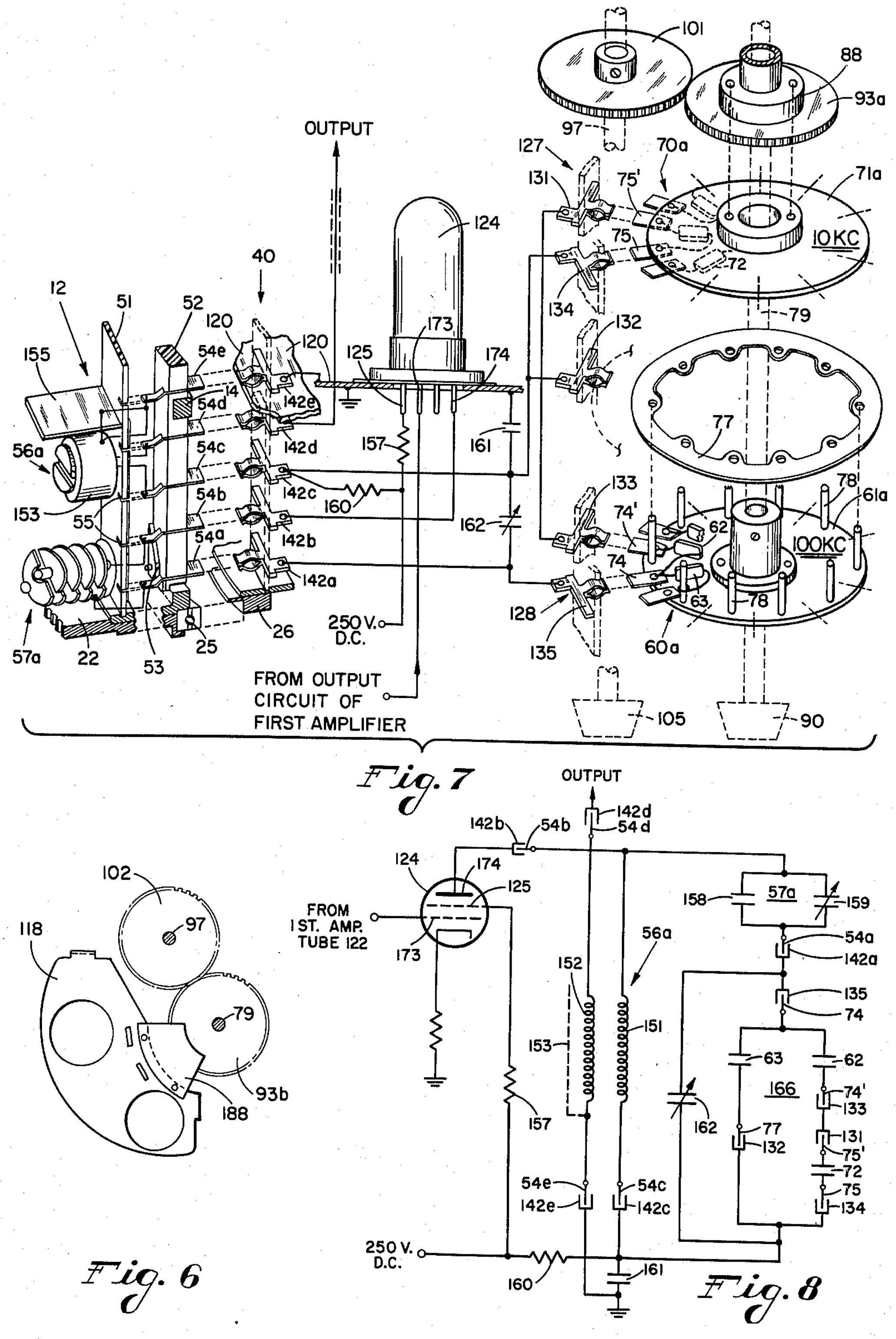
FIG. 6 is a view showing a typical arrangement for shielding tuned circuits from one another.
FIG. 7 is an exploded view of a portion of the device of FIGS. 1 and 2, including circuitry, for showing the manner of assembly of one of the tuned circuits and the manner of coupling to an electron device; and, FIG. 8 is a circuit diagram of an amplifier stage shown in FIG. 7 with the various switches and components shown.

The arrangement of the stationary contacts 131–135 relative to the ten kilocycle and one hundred kilocycle component assemblies 60 and 70, as well as the cooperation between the megacycle component assemblies 12 and the stationary contact assembly 40, is shown more clearly in FIGS. 7 and 8. In order to illustrate the operation of the tuner device, according to the invention, only one of the tuned circuits will be described in detail. The output tuned circuit in the output circuit of the second amplifier tube 124 is chosen for purposes of explanation. It should be understood that the other three tuned circuits may be similar to or identical with the one described in detail in FIGS. 7 and 8.

Before proceeding with a detailed description of the output tuned circuit, the three major portions which demine the frequency of that tuned circuit, namely, the megacycle portion, the one hundred kilocycle portion, and the ten kilocycle portion, will be described.

The selected megacycle portion of the tuned circuit includes a coil 151 which is connected to a capacitor 158 except at the lowest frequency setting. To compensate for tolerances of capacitor 158, a trimmer capacitor 159 may be connected in shunt with capacitor 158. A secondary winding 152 may be coupled to coil 151 in the case of the output tuned circuit described in detail herein. One end of the selected coil 151 is connected to a contact blade 54b which engages contact blade 142b of stationary contact assembly 40. The other end of coil 151 is connected to a contact blade 54c which engages contact blade 142c. The end of capacitors 158 and 159 not connected to coil 151 is connected to contact blade 54a which engages contact blade 142a of stationary contact assembly 40.

The selected one hundred kilocycle portion of the tuned circuit includes a selected pair of interconnected capacitors 62 and 63 mounted on disc 61a. One terminal of the selected capacitor 62 is connected by way of terminal blade 74' in the contact 133 of fixed contact assembly 127; capacitors 62 and 63 are joined together at terminal blade 74 which makes contact with the contact 135 of fixed contact assembly 128. Capacitor 63 is also connected to a post 78 staked to a rotatable ground ring 77; the latter, in turn, makes contact with contact 132 of fixed contact assembly 127.

The selected ten kilocycle portion of the tuned circuit includes a selected capacitor 72 mounted on disc 71a. One terminal of the selected capacitor 72 is connected by way of terminal blade 75 to contact 134 on fixed contact assembly 128. The other terminal of capacitor 72 is connected by way of terminal blade 75' to contact 131 of fixed contact assembly 127.

Connection between the megacycle portion and the one hundred kilocycle portion of the tuned circuit is made at one end between contact blade 142c and contact 132 and at the other end between contact 135 and contact blade 142a. Connection between the one hundred kilocycle portion and ten kilocycle portion of the tuned circuit is made at one end between contacts 134 and 132 and at the other end between contacts 131 and 133. The hundred kilocycle and ten kilocycle portions of the tuned circuit together form a parallel network 166.

As shown in FIG. 8, the grid connection 173 of tube 124 receives a signal from the plate circuit of the first amplifier tube 122. The tuned circuit disclosed in the plate circuit of tube 124 includes a megacycle portion, a one hundred kilocycle portion, and a ten kilocycle portion, already referred to. The megacycle portion of the tuned circuit includes the inductive portion 56a and a capacitive portion 57a. The inductive portion includes mutuallly coupled input and output windings 151 and 152, respectively, inasmuch as this is the output stage. The other three tuned circuits may use only a single winding 151 as the inductive portion 56a. One end of the input winding 151 is connected directly to one side of capacitors 158 and 159. The other end of winding 151 is connected through contact blades 54c and 142c (1) to a source of direct current voltage by way of plate decoupling resistor 160, (2) to ground by way of plate decoupling capacitor 161, and (3) to either of contacts 132 and 134 on stationary terminal assembly 127. Capacitor 161 also serves to isolate radio frequency currents from the direct current supply. A screen voltage dropping resistor 157 is connected in circuit with the screen 125 of tube 124. A shield 153 surrounding the two windings 151 and 152 is grounded to a portion of the chassis, such as shelf 120, through a shield element 155 mounted on terminal board 51, contact blade 54e of mounting member 50, and contact blade 142e on stationary contact assembly 40, in the order named.

The terminal of the capacitive portion 57a which is connected directly to coil 151 also is connected through contact blade 54b on mounting member 50 and contact blade 142b of stationary contact assembly 40 to the external plate connection 174 of tube 124. The other side of the capacitor portion 57a is connected through contact blades 54a and 142a to contact 135 on stationary terminal assembly 127. Contact 135, in turn, connects to a terminal blade 74 to which is attached one terminal of a selected capacitor 62 on the one hundred kilocycle component disc 61a. The capacitor 62, as well as capacitor 63, is selected by rotation of knob 90 on shaft 79. The other terminal of the selected capacitor 62 is connected by printed circuitry 166 (see FIG. 1) to the adjacent terminal blade 74' of disc 61a. One terminal of a corresponding capacitor 63 is connected to this blade 74; the other terminal is connected through printed circuitry 168 (see FIG. 1) to a stake 78, which, by virtue of its electrical connection to ground ring 77, is at radio frequency ground potential. A selected pair of these two capacitors 62 and 63 form the one hundred megacycle portion of the tuned circuit. Two such capacitors 62 and 63 are needed in order to provide proper tracking as the tuned circuit is varied step-wise over the entire frequency range.

The ten megacycle portion of the tuned circuit includes a selected capacitor 72 mounted on disc 71a and selected by knob 105 on shaft 97. One terminal of capacitor 72 is connected to ground through a path including terminal blade 75 of disc 71a, contact 134 of stationary terminal assembly 128, contact 132 of stationary terminal assembly 127 and ground ring 77. The other terminal of capacitor 72 on disc 71a is connected through terminal blade 75' of disc 71a, contacts 131 and 133 of stationary terminal assembly 127 to one of the capacitors 62 on disc 61a.

Summarizing, the tuned circuit comprises essentially the coil 151 in shunt with a pair of serially connected parallel capacitor networks 57a and 166. Compensation for tolerances in capacitance of the capacitors 62, 63 and 72 is provided by a variable capacitor 162 which is in parallel with the network 166. The purpose of the capacitor 158 in network 57a is to compensate for the variable rate of change of operating frequency as selection is made over different portions of the frequency band. For example, a shift from 3.00 mc. to 3.99 mc. involves substantially a thirty percent increase in frequency, while a shift from 10.00 mc. to 10.99 mc. would involve a frequency increase of only about ten percent. The 100 kc. and 10 kc. capacitor settings for, say, 3.48 mc. is the same as for, say, 7.48 mc. or 12.48 mc, however. Consequently, a distinct series capacitor 158 is necessary for each megacycle step so that the total capacitance represented by networks 57a and 116 increases as the operating frequency becomes lower. At the lowest megacycle frequency setting, however, the capacitor 158 may be omitted and the entire range of 0.99 mc. between the lowest megacycle setting at the next higher setting can be covered by the 10 kc. and 100 kc. capacitors only. Capacitor 159 normally is placed in parallel with capacitor 158 to compensate for tolerances in capacitor 158.

What is claimed is:

1. A mechanical switching device comprising a plurality of groups of tuning elements and at least one electron device, selected tuning elements from each of said groups combining to form at least one frequency-determining circuit, a cylindrical turret capable of being rotated about its central longitudinal axis to a selected one of several discrete positions, a first one of said groups of tuning elements being mounted to rotate with said turret, second and third groups of said tuning elements each mounted on members rotatable independently of one another within said turret about a common axis of rotation displaced from said longitudinal axis to a selected one of several discrete positions, and means including stationary contact means disposed within said turret adjacent said groups of said tuning elements and said electron device for interconnecting selected ones of said elements of each of said groups to form a single frequency-determining circuit and for connecting the single frequency-determining circuit thus formed to said electron device.

2. A mechanical switching device for selective syntheses of a plurality of frequency-determining circuits comprising a plurality of sets of groups of tuning elements, selected tuning elements from each group of said sets combining to form a single frequency-determining circuit, a cylindrical turret capable of being rotated about its central longitudinal axis to a selected one of several discrete positions, a first one of said groups of tuning elements for each of said sets being mounted to rotate with said turret, second and third groups of said tuning elements for each of said sets being mounted on members rotatable independently of one another within said turret about a common axis of rotation displaced from said longitudinal axis to a selected one of several discrete positions, and means including stationary contact means disposed within said turret adjacent said groups of said tuning elements for interconnecting selected ones of said elements of each group of said sets to form a single frequency-determining circuit corresponding to each set of groups of tuning elements.

3. A mechanical switching device for step-wise tuning of at least one tuned circuit comprising a cylindrical turret capable of being rotated to a selected one of several discrete positions, a plurality of tuning element assemblies affixed to the periphery of said turret and including several terminal blades extending radially into said turret, said assemblies each carrying a first group of tuning elements, a second group of tuning elements mounted upon a first discoidal member, a third group of tuning elements mounted upon a second discoidal member aligned with said first member, means for rotating said first and second members independently of one another, said first and second members each having a plurality of switch contacts arranged about the periphery thereof which are connected to corresponding tuning elements on said respective member, and means for selectively interconnecting said groups of tuning elements to form a single frequency-determining circuit, said means for interconnecting including stationary contact means mounted within said turret and carrying contact blades which engage selected switch contacts of said first and second members and a stationary contact assembly mounted within said turret and including contacts engaging said terminal blades of a selected one of said tuning element assemblies.

4. A mechanical switching device for step-wise tuning of at least one tuned circuit comprising a cylindrical turret capable of being rotated to a selected one of several discrete positions, a plurality of tuning element assemblies affixed to the periphery of said turret and including several terminal blades extending radially into said turret, said assemblies each carrying a first group of tuning elements, a second group of tuning elements mounted upon a first discoidal member, a third group of tuning elements mounted upon a second discoidal member aligned with said first member, a ground ring interposed between said first and second members and mounted to said first member, means for rotating said first and second members independently of one another, said first and second members each having a plurality of switch contacts arranged about the periphery thereof which are connected to corresponding tuning elements on said respective member, stationary contact means mounted within said turret and carrying contact blades which engage said ground ring and selected switch contacts of said first and second members, and a stationary contact assembly mounted within said turret, said contact assembly including contacts engaging said terminal blades of a selected one of said tuning element assemblies.

5. A mechanical switching device for step-wise tuning of a plurality of tuned circuits comprising a cylindrical turret capable of being rotated to a selected one of several discrete positions, a plurality of tuning element assemblies each carrying a first group of tuning elements for each tuned circuit, said assemblies being affixed to the periphery of said turret and including several terminal blades extending radially into said turret, a second group of tuning elements for each tuned circuit mounted upon a separate discoidal member, a third group of tuning elements for each tuned circuit mounted upon a separate discoidal member distinct from the aforementioned member, said members for the various tuned circuits being stacked in alignment, means for rotating the members carrying said second group of tuning elements independently of the members carrying said third group of tuning elements, said members for each tuned circuit having a plurality of switch contacts arranged about the periphery thereof for connection to appropriate tuning elements, stationary contact means mounted within said turret and carrying contact blades which engage selected switch contacts of the various ones of said members, and a stationary contact assembly mounted within said turret, said contact assembly including contacts engaging said terminal blades of a selected one of said tuning element assemblies.

6. A mechanical switching device for step-wise tuning of a plurality of tuned circuits comprising a cylindrical turret capable of being rotated to a selected one of several discrete positions, a plurality of tuning element assemblies each carrying a first group of tuning elements for each tuned circuit, said assemblies being affixed to the periphery of said turret and including several terminal blades extending radially into said turret, a second group of tuning elements for each tuned circuit mounted upon a separate discoidal member, a third group of tuning elements for each tuned circuit mounted upon a separate discoidal member distinct from the aforementioned member, said members for the various tuned circuits being stacked in alignment, means for rotating the members carrying said second group of tuning elements independently of the members carrying said third group of tuning elements, said members for each tuned circuit having a plurality of switch contacts arranged about the periphery thereof for connection to appropriate tuning elements, electrically conductive shielding means extending between those of said members of different tuned circuits which are adjacent, stationary contact means mounted within said turret and carrying contact blades which engage selected switch contacts of the various ones of said members, and a stationary contact assembly mounted within said turret, said contact assembly including contacts engaging said terminal blades of a selected one of said tuning element assemblies.

7. A frequency tuner for selectively synthesizing each of a plurality of tuned circuits from selected ones of a multiplicity of groups of tuned circuit portions, said tuned circuit portions of each group including at least one frequency-determining component, a rotatable turret, each of the tuned circuit portions of a first of said groups being mounted on members disposed about the periphery of said turret, a stationary contact means positioned within said turret adjacent the periphery thereof, first selector means for driving said turret to a position at which a selected one of said mounting members comes into circuit with said first stationary contact means, first and second sets of discs mounted within said turret, each of said sets having a separate disc for each of the tuned circuits, each of said discs of said first and second sets having mounted thereon respectively a second group of tuned circuit portions and a third group of tuned circuit portions, second stationary contact means mounted adjacent the aforesaid discs, second selector means for controllably rotating said discs of said first set until a selected one of said second group of tuned circuit portions for each of the tuned circuits is connected to said second stationary contact means, third selector means for controllably rotating said second set of discs independently of said first set of discs until a selected one of said third group of tuned circuit portions for each of the tuned circuits is connected to said second stationary contact means, and at least one electron device mounted within said turret and connected in circuit with said first and second stationary contact means.

8. A frequency tuner for selectively synthesizing each of a plurality of tuned circuits from selected ones of a multiplicity of groups of tuned circuit portions, said tuned circuit portions of each group including at least one frequency-determining component, a rotatable turret, each of the tuned circuit portions of a first of said groups being mounted on members disposed about the periphery of said turret, said frequency-determining components of the first group of tuned circuit portions having adjusting means accessible from outside said turret, a stationary contact means positioned within said turret adjacent the periphery thereof, first selector means for driving said turret to a position at which a selected one of said mounting members comes into circuit with said first stationary contact means, first and second sets of discs mounted within said turret, each of said sets having a separate disc for each of the tuned circuits, each of said discs of said first and second sets having mounted thereon respectively a second group of tuned circuit portions and a third group of tuned circuit portions, second stationary contact means mounted adjacent the aforesaid discs, second selector means for controllably rotating said discs of said first set until a selected one of said second group of tuned circuit portions for each of the tuned circuits is connected to said second stationary contact means, third selector means for controllably rotating said second set of discs independently of said first set of discs until a selected one of said third group of tuned circuit portions for each of the tuned circuits is connected to said second stationary contact means, and at least one electron device mounted within said turret and connected in circuit with said first and second stationary contact means.

9. A frequency tuner for selectively synthesizing each of a plurality of tuned circuits from selected ones of a multiplicity of groups of tuned circuit portions, said tuned circuit portions of each group including at least one frequency-determining component, a rotatable turret, each of the tuned circuit portions of a first of said groups being mounted on members disposed about the periphery of said turret, a stationary contact means positioned within said turret adjacent the periphery thereof, first selector means for driving said turret to a position at which a selected one of said mounting members comes into circuit with said first stationary contact means, first and second sets of discs mounted within said turret, each of said sets having a separate disc for each of the tuned circuits, each of said discs of said first and second sets having mounted thereon respectively a second group of tuned circuit portions and a third group of tuned circuit portions, second stationary contact means mounted adjacent the aforesaid discs, second selector means for contrallably rotating said discs of said first set until a selected one of said second group of tuned circuit portions for each of the tuned circuits is connected to said second stationary contact means, third selector means for controllably rotating said second set of discs independently of said first set of discs until a selected one of said third group of tuned circuit portions for each of the tuned circuits is connected to said second stationary contact means, said tuned circuit portions of said first group for all of said tuned circuits being mounted on a common mounting member, each mounting member having electrically conductive elements for shielding from one another the first group of frequency-determining components of different tuned circuits.

10. A frequency tuner for selectively synthesizing each of a plurality of tuned circuits from selected ones of three groups of tuned circuit portions, said tuned circuit portions of each group including at least one frequency-determining component, a hollow cylindrical turret rotatable about its central longitudinal axis, each of the tuned circuit portions of said first group being circumferentially disposed about the periphery of said turret and including a plurality of terminal blades extending into the space within said turret, a stationary contact assembly mounted within said turret adjacent the inner periphery thereof, first selector means for rotating said turret to a position at which the terminal blades of a selected one of said tuned circuit portions of said first group engages contacts of said stationary contact assembly, a first disc and a second mounted within said turret for each tuned circuit, said first and second discs having mounted thereon respectively a second group of tuned circuit portions and a third group of tuned circuit portions, contact blades attached to the periphery of said discs and connected to certain frequency-determining components of the corresponding groups of tuned circuit portions, second selector means for controllably rotating said first disc about an axis parallel to but displaced from said central longitudinal axis of said turret until a selected one of said second group of tuned circuit portions for each of the tuned circuits is connected to said stationary contact means, and third selector means for controllably rotating said second disc independently of said first disc about the same axis of rotation as said first disc until a selected one of said third group of tuned circuit portions for each of the tuned circuits is connected to said statationary contact means.

11. A frequency tuner for selectively synthesizing each of a plurality of tuned circuits from selected ones of three groups of tuned circuit portions, said tuned circuit portions of each group including at least one frequency-determining component, a hollow cylindrical turret rotatable about its central longitudinal axis, each of the tuned circuit portions of said first group being circumferentially disposed about the periphery of said turret and including a plurality of terminal blades extending into the space within said turret, a stationary contact assembly mounted within said turret adjacent the inner periphery thereof, first selector means for rotating said turret to a position at which the terminal blades of a selected one of said tuned circuit portions of said first group engages contacts of said stationary contact assembly, a first disc and a second disc mounted within said turret for each tuned circuit, said first and second discs having mounted thereon respectively a second group of tuned circuit portions and a third group of tuned circuit portions, contact blades attached to the periphery of said discs and connected to certain frequency-determining components of the corresponding groups of tuned circuit portions, second selector means for controllably rotating said first disc about an axis parallel to but displaced from said central longitudinal axis of said turret until a selected one of said second group of tuned circuit portions for each of the tuned circuits is connected to said stationary contact means, third selector means for controllably rotating said second disc independently of said first disc about the same axis of rotation as said first disc until a selected one of said third group of tuned circuit portions for each of the tuned circuits is connected to said stationary contact means, and at least one electron device mounted within said turret and means for connecting said stationary contact assembly and said stationary contact means to said electron device.

12. A frequency tuner for selectively synthesizing each of a plurality of tuned circuits from selected ones of three groups of tuned circuit portions, said tuned circuit portions of each group including at least one frequency-determining component, a hollow cylindrical turret, each of the tuned circuit portions of said first group being circumferentially disposed about the periphery of said turret and including a plurality of terminal blades extending into the space within said turret, a stationary contact assembly mounted within said turret adjacent the inner periphery thereof, first selector means for rotating said turret to a position at which the terminal blades of a selected one of said tuned circuit portions of said first group engages contacts of said stationary contact assembly, a first disc and a second disc mounted within said turret for each tuned circuit, said first and second discs having mounted thereon respectively a second group of tuned circuit portions and a third group of tuned circuit portions, contact blades attached to the periphery of said discs and connected to certain frequency-determining components of the corresponding groups of tuned circuit portions, second selector means for controllably rotating said first disc until a selected one of said second group of tuned circuit portions for each of the tuned circuits is connected to said stationary contact means, and third selector means for controllably rotating said second disc independently of said first disc until a selected one of said third group of tuned circuit portions for each of the tuned circuits is connected to said stationary contact means.

13. A frequency tuner for selectively synthesizing each of a plurality of tuned circuits from selected ones of three groups of tuned circuit portions, said tuned circuit portions of each group including at least one frequency-determining component, a hollow cylindrical turret, each of the tuned circuit portions of said first group being circumferentially disposed about the periphery of said turret and including a plurality of terminal blades extending into the space within said turret, said frequency-determining components of the first group of tuned circuit portions having adjusting means accessible from outside said turret, a stationary contact assembly mounted within said turret adjacent the inner periphery thereof, first selector means for rotating said turret to a position at which the terminal blades of a selected one of said tuned circuit portions of said first group engages contacts of said stationary contact assembly, a first disc and a second disc mounted within said turret for each tuned circuit, said first and second discs having mounted thereon respectively a second group of tuned circuit portions and a third group of tuned circuit portions, contact blades attached to the periphery of said discs and connected to certain frequency-determining components of the corresponding groups of tuned circuit portions, second selector means for controllably rotating said first disc until a selected one of said second group of tuned circuit portions for each of the tuned circuits is connected to said stationary contact means, and third selector means for controllably rotating said second disc independently of said first disc until a selected one of said third group of tuned circuit portions for each of the tuned circuits is connected to said stationary contact means.

14. A frequency tuner for selectively synthesizing each of a plurality of tuned circuits from selected ones of three groups of tuned circuit portions, said tuned circuit portions of each group including at least one frequency-determining component, a hollow cylindrical turret rotatable about its central longitudinal axis, each of the first group of tuned circuit portions for all of said tuned circuits being supported from a common mounting member, the various mounting members of said first group of tuned circuit portions being circumferentially disposed about the periphery of said turret and removably attached thereto, a plurality of terminal blades extending through each mounting member into the space within said turret and connected to certain ones of said frequency-determining components, a stationary contact assembly mounted within said turret and including a number of sections equal to the number of tuned circuits, first selector means for rotating said turret to a position at which the terminal blades of a selected one of said mounting members engages said contacts of said stationary contact assembly, first and second sets of discs mounted within said turret, each of said sets having a separate disc for each tuned circuit, each of said discs of said first and second sets having mounted thereon respectively a second group of tuned circuit portions and a third group of tuned circuit portions, contact blades attached to the periphery of said discs and connected to certain frequency-determining components of the corresponding groups of tuned circuit portions, second selector means for controllably rotating said first set of discs about an axis parallel to but displaced from said central longitudinal axis of said turret until a selected one of said second group of tuned circuit portions for each of the tuned circuits is connected to said stationary contact means, third selector means for controllably rotating said second set of discs independently of said first set of discs about the same axis of rotation as said first set of discs until a selected one of said third group of tuned circuit portions for each of the tuned circuits is connected to said stationary contact means, at least one electron device mounted within said turret and means for interconnecting said stationary contact means and said electron device.

References Cited by the Examiner

UNITED STATES PATENTS

| | | | |
|---|---|---|---|
| 2,698,388 | 12/54 | Cage | 334—51 |
| 2,758,207 | 8/56 | Parzen | 334—47 X |
| 2,798,955 | 7/57 | Balash | 334—50 X |
| 2,858,439 | 10/58 | Tyminski et al. | 334—50 |
| 2,997,582 | 8/61 | Silvey | 334—51 X |

HERMAN KARL SAALBACH, *Primary Examiner.*

GEORGE N. WESTBY, *Examiner.*